United States Patent
Himpe et al.

(10) Patent No.: US 6,762,632 B1
(45) Date of Patent: Jul. 13, 2004

(54) RESET DRIVER CIRCUITS AND METHODS

(75) Inventors: Vincent Himpe, Kampenhout (BE); Cal Swanson, Apex, NC (US)

(73) Assignee: STMicroelectronics, Inc., Carrollton, TX (US)

(*) Notice: Subject to any disclaimer, the term of this patent is extended or adjusted under 35 U.S.C. 154(b) by 0 days.

(21) Appl. No.: 10/440,075

(22) Filed: May 15, 2003

(51) Int. Cl.[7] .............................. H03L 7/00; H03K 3/02
(52) U.S. Cl. ....................... 327/142; 327/143; 327/198
(58) Field of Search .............................. 327/142, 143, 327/198, 318, 319, 321, 322, 323, 327, 328, 331, 332

(56) References Cited

U.S. PATENT DOCUMENTS

| | | | | |
|---|---|---|---|---|
| 5,345,583 A | * | 9/1994 | Davis ............................ | 714/23 |
| 5,644,250 A | * | 7/1997 | Ooishi ........................... | 326/16 |
| 5,880,611 A | | 3/1999 | Danstrom ..................... | 327/142 |
| 5,959,477 A | | 9/1999 | Chung .......................... | 327/143 |
| 6,069,574 A | | 5/2000 | Eo et al. ........................ | 341/50 |
| 6,072,732 A | | 6/2000 | McClure ...................... | 365/191 |
| 6,134,686 A | * | 10/2000 | Jha .............................. | 714/724 |
| 6,157,579 A | | 12/2000 | Micheloni et al. ..... | 365/189.07 |
| 6,236,249 B1 | | 5/2001 | Choi et al. ................... | 327/143 |
| 6,363,025 B1 | | 3/2002 | McLaury ..................... | 365/226 |
| 6,377,090 B1 | | 4/2002 | Bruno .......................... | 327/143 |
| 2001/0054921 A1 | | 12/2001 | Akiyoshi ..................... | 327/143 |
| 2002/0063589 A1 | | 5/2002 | Nguyen ....................... | 327/143 |
| 2002/0075745 A1 | | 6/2002 | McLaury ..................... | 327/142 |
| 2002/0089860 A1 | | 7/2002 | Kashima et al. ............... | 363/13 |
| 2002/0140439 A1 | | 10/2002 | Enam et al. ................. | 324/678 |
| 2002/0140689 A1 | | 10/2002 | Huang et al. ................ | 345/208 |
| 2002/0145454 A1 | | 10/2002 | Jensen ......................... | 327/142 |

* cited by examiner

*Primary Examiner*—Tuan T. Lam
(74) *Attorney, Agent, or Firm*—Lisa K. Jorgenson; William J. Kubida

(57) ABSTRACT

Circuits and methods for generating a reset signal are disclosed. A reset driver circuit receives a reset signal from a circuit, e.g., a reset generator and an input signal indicative of a required characteristic of a reset signal for a second circuit. The reset driver compares a characteristic of the reset signal with the input signal indicative of a required characteristic of a reset signal for a second circuit and generates an output signal that includes the required characteristics of the reset signal for a second circuit. A reset driver circuit may be placed in a communication path between a conventional reset generator and a second circuit that requires a reset signal.

30 Claims, 4 Drawing Sheets

RESET DRIVER CIRCUITS AND METHODS

TECHNICAL FIELD

The present invention relates to electronic circuits, and more particularly to electronic circuits for providing a reset signal to another electronic circuit.

BACKGROUND

Most programmed or programmable type logic circuits must be set in a zero state or reset state when powered on to assure that their constitutive elements do not present undetermined logic states. The power on reset (POR) circuits provided for this deliver a reset signal when the supply voltage rises and reaches a first switching threshold $V_1$, and release the reset signal when the voltage reaches a second switching threshold $V_2$. According to the chosen convention, the active value of the reset signal may be 1 or 0. The release of the reset signal corresponds to its setting to 0 in the first case and to its setting to 1 in the second case.

Electronic circuits may implement a reset signal with a positive polarity or a negative polarity. Existing reset signal generators lack the ability to detect whether the circuit to which the reset signal is directed requires a negative polarity active reset signal or a positive polarity active reset signal. As a result, both positive polarity and negative polarity reset signal generators must exist in the marketplace. Use of the wrong signal generator is a design flaw that requires redesign.

Therefore, there is a need in the art for a circuit that detects the required polarity of a circuit's reset signal and provides a reset signal of the appropriate polarity.

SUMMARY

In one aspect, a reset driver circuit for generating an input reset signal for a second circuit is provided. The reset driver circuit comprises means for generating a first signal indicative of a required characteristic of an input reset signal for a second circuit; means for comparing the first signal and a second signal indicative of a characteristic of a first input reset signal; and means for generating a second input reset signal that includes the required characteristic of an input reset signal for a second circuit.

In another aspect, a method of generating an input reset signal is provided. The method comprises generating a first signal indicative of a required characteristic of an input reset signal for a second circuit; comparing the first signal and a signal indicative of a characteristic of a first reset signal; and generating a second reset signal that includes the required characteristic of an input reset signal for a second circuit.

In another aspect, a reset driver circuit for generating an input reset signal for a second circuit is provided. The reset driver circuit comprises a flip-flop having an input connected to the reset input of a second circuit; a first comparator including a first input connected to a first output of the flip-flop and a second input that receives an external reset signal; a second comparator including a first input connected to a second output of the flip-flop and a second input that receives an external reset signal; a first switch connected to the output of the first comparator for selectively connecting the reset input of the second circuit to a first voltage; and a second switch connected to the output of the second comparator for selectively connecting the reset input of the second circuit to a second voltage.

In yet another aspect, a reset driver circuit for generating an input reset signal for a second circuit is provided. The reset driver circuit comprises a first flip-flop having a first input for receiving a reset input signal, and generating a first signal indicative of a characteristic of the reset input signal; a second flip-flop having an input connected to a reset input pin of a second circuit and generating second and third outputs indicative of a characteristic of the reset input pin; a digital logic circuit for comparing the first output with at least one of the second output and the third output; a first switch connected to the output of the digital logic circuit for selectively connecting the reset input of the second circuit to a first voltage; and a second switch connected to the output of the digital logic circuit for selectively connecting the reset input of the second circuit to a second voltage.

DETAILED DESCRIPTION

Figure 1:
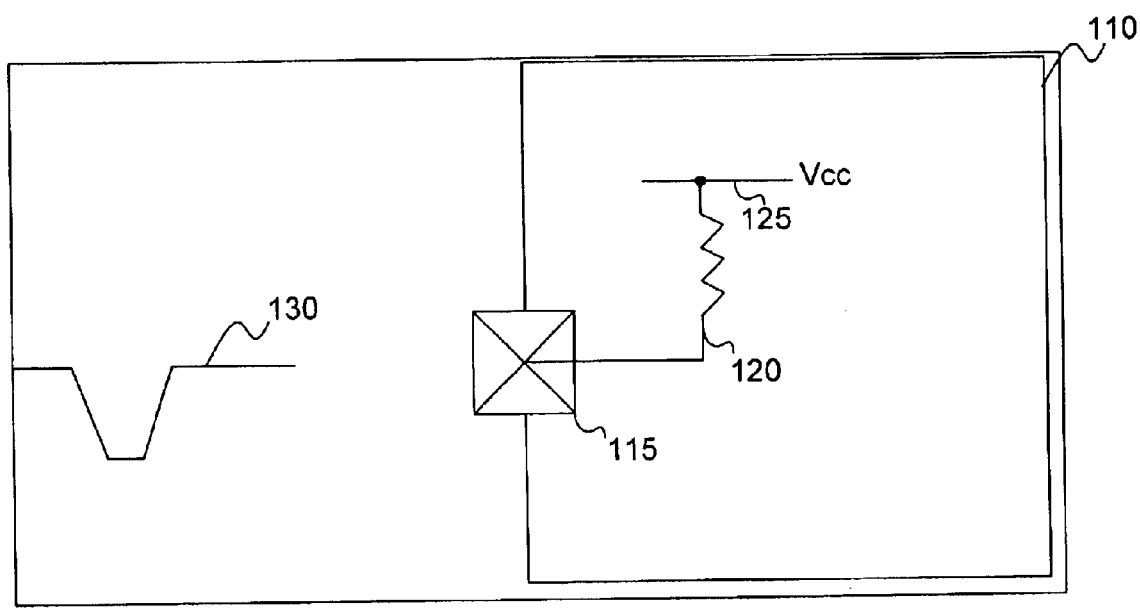
FIG. 1 is a schematic illustration of the reset input of a circuit that requires an active low reset input.

FIG. 1 is a schematic illustration of the reset input of a circuit 110 that requires an active low reset input. Referring now to FIG. 1, the reset input 115 of a circuit 110 that requires an active low reset signal will provide an electrical path 120 to the power pin, or $V_{cc}$ 125. A reset signal 130 having a negative polarity will reset the circuit.

Figure 2:
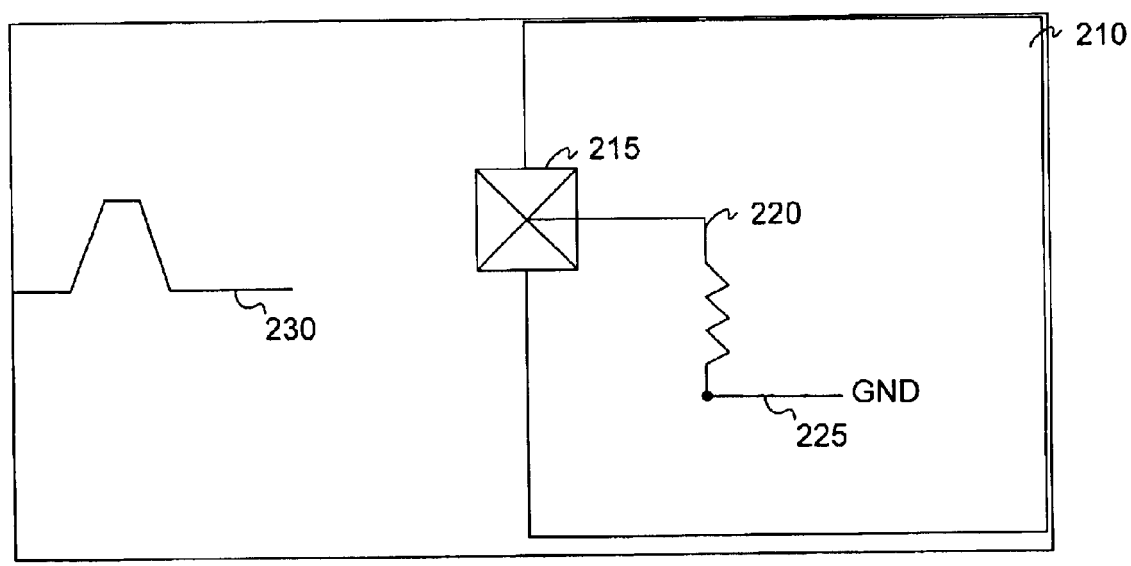
FIG. 2 is a schematic illustration of the reset input of a circuit that requires an active high reset input.

FIG. 2 is a schematic illustration of the reset input of a circuit that requires an active high reset input. Referring now to FIG. 2, the reset input 215 of a circuit 210 that requires an active high reset signal will provide an electrical path 220 to the GND pin 225. A reset signal 230 having a positive polarity will reset the circuit.

Typically, a reset generator is used to supply the reset signal to the second circuit. Reset generators are known in the art. Exemplary reset generators are disclosed in, e.g., U.S. Pat. Nos. 5,880,611, 6,072,732, 6,236,249, and 6,377,090, and published U.S. patent application Ser. Nos. 2001/0054921, 2002/0075745, and 2002/0063589, the complete disclosures of which are incorporated herein by reference. One of skill in the art could readily adapt the exemplary reset driver circuits described and claimed herein, and equivalents thereof, to operate in conjunction with existing reset generator circuits. Accordingly, the particular design of the reset generator circuit with which the circuits described and claimed herein, or equivalents thereof, are not critical. As described above, conventional reset generators produce a reset signal of either positive or negative polarity. The circuits described and claimed herein may be placed in the communication path between a reset generator and the reset input of a second circuit to ensure that the reset signal input to the second circuit is always the appropriate polarity.

Figure 3:
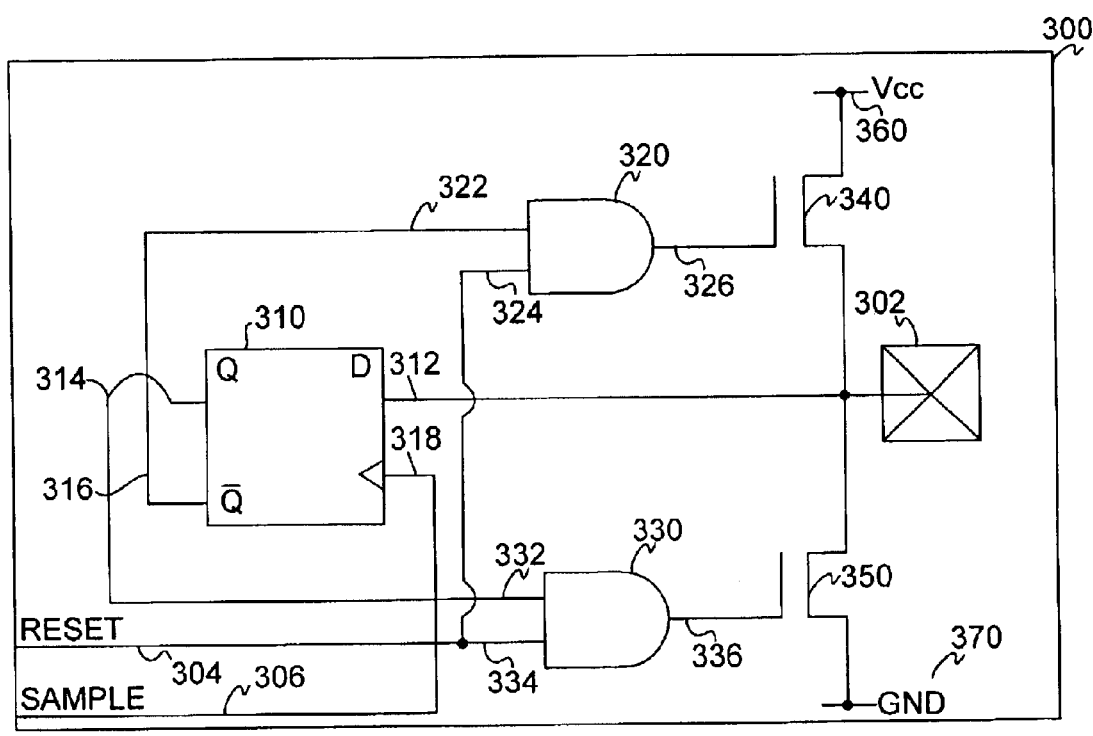
FIG. 3 is a schematic illustration of an exemplary first circuit that determines whether a second circuit requires an active high reset or an active low reset and generates a reset signal of the appropriate polarity.

FIG. 3 is a schematic illustration of an exemplary circuit that determines whether a second circuit requires an active high reset or an active low reset and generates a reset signal of the appropriate polarity. Referring to FIG. 3, circuit 300 includes a D flip-flop 310, a first AND gate 320, a second AND gate 330, a first transistor 340, and a second transistor 350. A first input node 302 may be connected to the reset input pin of a second circuit. A second input 304 may receive a reset signal from a reset signal generator. A third input 306 may receive a sample signal.

The D input of flip-flop 310 is connected to the first node 302. The clock input 318 of flip-flop 310 receives the sample signal from input 306. The Q output 314 of flip-flop 310 is connected to the first input 332 of AND gate 330. The $Q_{bar}$ output 316 of flip-flop 310 is connected to the first input 322 of AND gate 320. The reset signal from second input 304 is connected to the second input 324 of AND gate 320 and the second input 334 of AND gate 330. The output 326 of AND gate 320 is directed to a transistor 340, and the output 336 of AND gate 330 is directed to transistor 350.

Circuit 300 may be placed in the communication path between a reset signal generator and the reset input of a second circuit that receives a reset signal. Circuit 300 determines whether the second circuit requires a positive polarity reset signal or a negative polarity reset signal, and generates an output on node 302 of the appropriate polarity. More particularly, circuit 300 samples the voltage at node 302 to determine whether the second circuit requires a positive polarity reset signal or a negative polarity reset signal, and executes logic that drives the signal at node 302 to the appropriate polarity.

In operation, when the circuit 300 and its accompanying circuits are powered-up, circuit 300 will sample the voltage (logic level) at node 302 while 304 is low. If the circuit to which circuit 300 provides a reset input requires an active high reset, then node 302 will be low. In this instance a low input will be provided to the D flip-flop, driving the Q output 314 low and the $Q_{bar}$ output 316 high. If the reset signal on line 304 is high, then the output 326 of AND gate 320 is driven high while the output 336 of AND gate 330 remains low. The high output 326 of AND gate 320 activates transistor 340, which acts as a switch to connect node 302 to a power supply, thereby pulling node 302 up to a high output. By contrast, if the reset signal on line 304 is low, then the output 326 of AND gate 320 and the output 336 of AND gate 330 are driven low. Neither of the transistors 340, 350 is activated, and the output signal on node 302 remains low.

If the circuit to which circuit 300 provides a reset input requires an active low reset, then the voltage (logic level) at node 302 will be high while 304 is low. In this instance a high input will be provided to the D flip-flop, driving the Q output 314 high and the $Q_{bar}$ output 316 low when circuit 300 is sampled. If the reset signal on line 304 is high, then the output 336 of AND gate 330 is driven high while the output 326 of AND gate 320 is driven low. The high output 336 of AND gate 330 activates transistor 350, which acts as a switch to connect node 302 to GND, thereby pulling node 302 down to a low output. By contrast, if the reset signal on line 304 is low, then the output 326 of AND gate 320 and the output 336 of AND gate 330 are driven low. Neither of the transistors 340, 350 is activated, and the output signal on node 302 remains high.

Thus, circuit 300 provides an exemplary means for determining the required polarity of an input reset signal to a second circuit and providing an input reset of the appropriate polarity to the second circuit. More particularly, circuit 300 provides an exemplary means for generating a first signal representative of the required polarity of the reset input signal for a second circuit, i.e., a flip-flop that generates an output signal indicative of the required polarity of a reset input signal. In addition, circuit 300 provides an exemplary means for comparing the first signal and a second signal indicative of the polarity of a reset input signal, i.e., one or more AND gates. Further, circuit 300 provides an exemplary means for generating a second input reset signal that includes the required characteristic of an input reset signal for a second circuit, i.e., the transistors 340, 350 that act as a switch to generate the output signal. As used herein, the term comparing shall be construed to include the execution of digital logic to determine whether one or more input to the digital logic satisfies a condition, e.g., whether one or more inputs corresponds to a logic high or a logic low.

One of skill in the art will recognize that numerous substitutions and modifications could be made to circuit 300 to produce an equivalent circuit. By way of example, the AND gates could be replaced with NOR gates and the logic signals reversed, Alternate embodiments could be constructed with NAND gates, OR gates, or inverters. In addition, the D flip-flop 310 could be replaced with another type of flip-flop. Further, transistors 340, 350 may be conventional field effect transistors (FETs) but could be replaced with another type of switch. Any such modifications are considered within the scope of the present invention.

Figure 4:
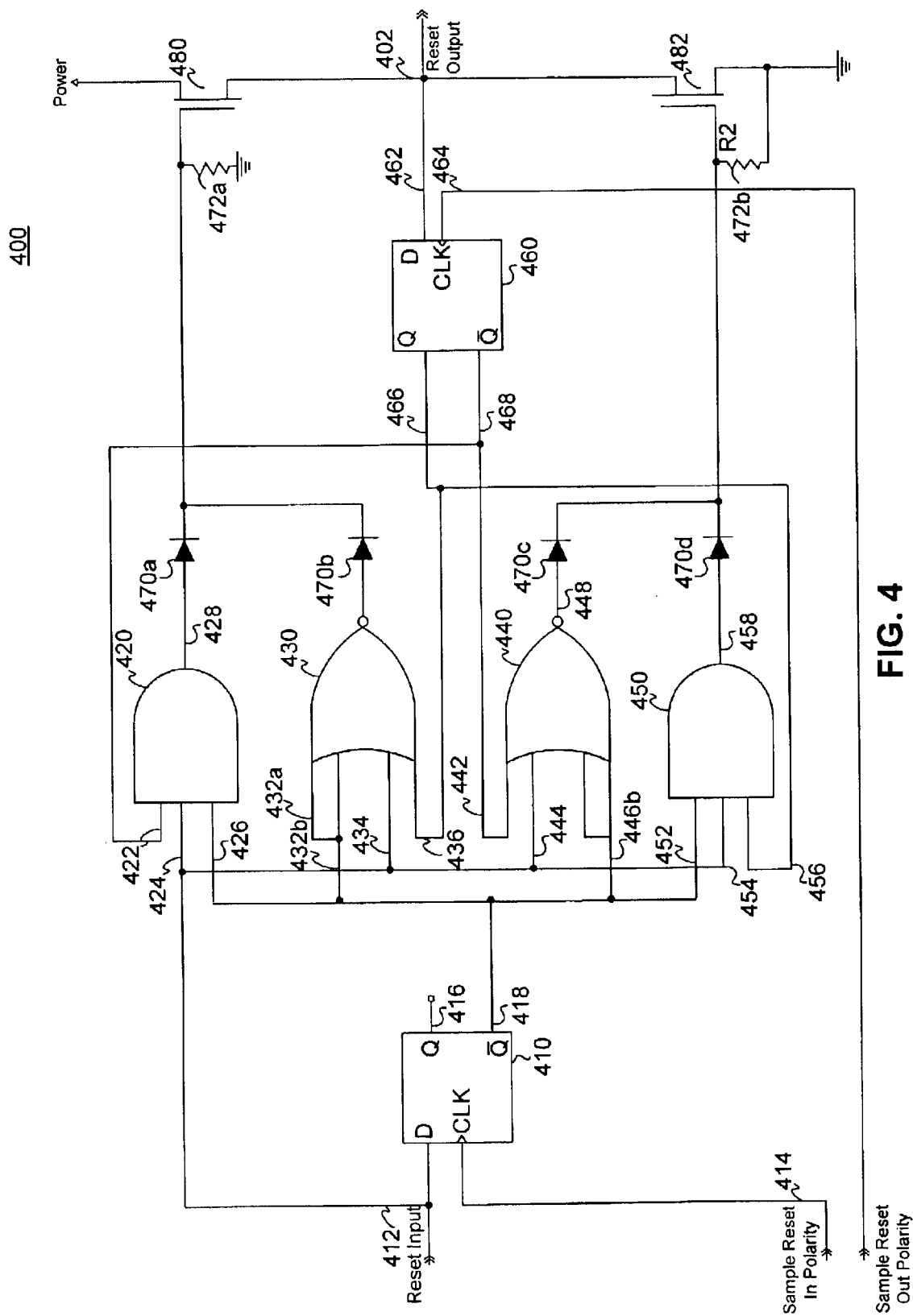
FIG. 4 is a schematic illustration of an alternate embodiment of an exemplary first circuit that determines whether a second circuit requires an active high reset or an active low reset and generates a reset signal of the appropriate polarity.

FIG. 4 is a schematic illustration of an alternate embodiment of an exemplary first circuit that determines whether a second circuit requires an active high reset or an active low reset and generates a reset signal of the appropriate polarity. Referring to FIG. 4, circuit 400 includes a first D flip-flop 410 that receives a reset input signal 412, e.g., from a reset generator. Flip-flop 410 further includes a clock input 414, a Q output 416, and a $Q_{bar}$ output 418. Flip-flop 410 samples the reset input signal and generates Q and $Q_{bar}$ outputs in accordance with the conventional operation of a flip-flop.

Circuit 400 further includes a second flip-flop 460. A first input node 402 may be connected to the reset input pin of a second circuit, and the D input of flip-flop 460 is connected to the first node 402. Flip-flop 460 further includes a clock input that receives a signal on line 464 and a Q output 466 and a $Q_{bar}$ output 468. Flip-flop 460 samples the reset initial condition of signal and generates Q and $Q_{bar}$ outputs in accordance with the conventional operation of a flip-flop. Flip-flop 460 samples the initial condition of the second circuit to determine whether the second circuit requires an active low reset or an active high reset.

Circuit 400 further includes two AND gates 420, 450 and two NOR gates 430, 440 that receive the outputs from flip-flops 410, 460 and implement the logic that actives transistors 480, 482 to generate a reset OUT signal of the appropriate polarity. The various inputs and outputs of these logic gates are described below in connection with the description of the operation of circuit 400. Circuit 400 may include resistors 472a, 472b to permit the charge applied to transistors 480, 482 to bleed off. In addition, circuit 400 may include diodes 470a, 470b, 470c, 470d to preclude current from flowing back into the logic gates that are not in an active state.

Circuit 400 may be implemented in circuitry in which there is an idle or normal operational state where neither the input nor the output is in reset. Circuit 400 initially stores the first the reset input state and second the reset output state during this time. Storing this reset input condition first ensures that the $Q_{bar}$ output 418 of flip-flop 410 is initialized in the opposite state of the reset input 412. This, in turn, ensures that none of the outputs of logic gates 420, 430, 440, 450 can be high in its initial state. Accordingly, the FETs cannot interfere with sampling the initial condition at node 402.

Circuit 400 may be used in conjunction with a reset generator that generates a reset signal that toggles between a low state and a high state. In operation, circuit 400 inverts reset input signals of the incorrect polarity for the second circuit connected to the reset output node 402. Operation of circuit 400 will be explained by way of the following four examples.

In a first condition, assume the circuit connected to node 402 has an active low reset, i.e., the circuit requires a reset signal of negative polarity, and the initial reset input signal is of positive polarity. In this instance, the initial state reset input 412 is high, while $Q_{bar}$ output 418 is low. The reset input signal is provided as an input to AND gates 420, 450, and NOR gates 430, 440 and the $Q_{bar}$ output 418 is provided as an input to AND gates 420, 450, and to NOR gates 430, 440. The initial sample of node 402 will reflect a high input. Thus, the Q output 466 is set high, while $Q_{bar}$ output 468 is set to logic low. Q output 466 is provided as an input to NOR gate 430 and to AND gate 450, and the $Q_{bar}$ output 468 is provided to AND gate 420 and to NOR gate 440. In this state, neither the AND gates 420, 450 nor the NOR gates 430, 440 are activated, and as long as the reset input signal 412 remains high node 402 remains unchanged. However, if the reset input signal 412 toggles low, then all inputs to NOR gate 440 are low, which activates transistor 482 to pull the output signal at 402 low.

In a second condition, assume the circuit connected to node 402 has an active low reset, i.e., the circuit requires a reset signal of negative polarity, and the initial reset input signal is of negative polarity. In this instance, the initial state reset input 412 is low, while $Q_{bar}$ output 418 is high. The reset input signal is provided as an input to AND gates 420, 450, and NOR gates 430, 440 and the $Q_{bar}$ output 418 is provided as an input to AND gates 420, 450, and to NOR gates 430, 440. The initial sample of node 402 will reflect a high input. Thus, the Q output 466 is set high, while $Q_{bar}$ output 468 is set to logic low. Q output 466 is provided as an input to NOR gate 430 and to AND gate 450, and the $Q_{bar}$ output 468 is provided to AND gate 420 and to NOR gate 440. In this state, neither the AND gates 420, 450 nor the NOR gates 430, 440 are activated, and as long as the reset input signal 412 remains low node 402 remains unchanged. However, if the reset input signal 412 toggles high, then all inputs to AND gate 450 are high, which activates transistor 482 to pull the output signal at 402 low.

In a third condition, assume the circuit connected to node 402 has an active high reset, i.e., the circuit requires a reset signal of positive polarity, and the initial reset input signal is of positive polarity. In this instance, the initial state reset input 412 is high, while $Q_{bar}$ output 418 is low. The reset input signal is provided as an input to AND gates 420, 450, and NOR gates 430, 440 and the $Q_{bar}$ output 418 is provided as an input to AND gates 420, 450, and to NOR gates 430, 440. The initial sample of node 402 will reflect a low input. Thus, the Q output 466 is set low, while $Q_{bar}$ output 468 is set to logic high. Q output 466 is provided as an input to NOR gate 430 and to AND gate 450, and the $Q_{bar}$ output 468 is provided to AND gate 420 and to NOR gate 440. In this state, neither the AND gates 420, 450 nor the NOR gates 430, 440 are activated, and as long as the reset input signal 412 remains high node 402 remains unchanged. However, if the reset input signal 412 toggles low, then all inputs to NOR gate 430 are low, which activates transistor 480 to pull the output signal at 402 high.

In a fourth condition, assume the circuit connected to node 402 has an active high reset, i.e., the circuit requires a reset signal of positive polarity, and the initial reset input signal is of negative polarity. In this instance, the initial state reset input 412 is low, while $Q_{bar}$ output 418 is high. The reset input signal is provided as an input to AND gates 420, 450, and NOR gates 430, 440 and the $Q_{bar}$ output 418 is provided as an input to AND gates 420, 450, and to NOR gates 430, 440. The initial sample of node 402 will reflect a low input. Thus, the Q output 466 is set low, while $Q_{bar}$ output 468 is set to logic high. Q output 466 is provided as an input to NOR gate 430 and to AND gate 450, and the $Q_{bar}$ output 468 is provided to AND gate 420 and to NOR gate 440. In this state, neither the AND gates 420, 450 nor the NOR gates 430, 440 are activated, and long as the reset input signal 412 remains high node 402 remains unchanged. However, if the reset input signal 412 toggles low, then all inputs to AND gate 420 are high, which activates transistor 480 to pull the output signal at 402 high.

Thus, circuit 400 also provides an exemplary means for determining the required polarity of an input reset signal to a second circuit and providing an input reset of the appropriate polarity to the second circuit. More particularly, circuit 400 provides an exemplary means for generating a first signal representative of the required polarity of the reset input signal for a second circuit, i.e., a flip-flop that generates an output signal indicative of the required polarity of a reset input signal. In addition, circuit 400 provides an exemplary means for comparing the first signal and a second signal indicative of the polarity of a reset input signal, i.e., one or more AND gates in combination with one or more NOR gates. Further, circuit 400 provides an exemplary means for generating a second input reset signal that includes the required characteristic of an input reset signal for a second circuit, i.e., the transistors 480, 482 that act as a switch to generate the output signal.

One of skill in the art will recognize that numerous substitutions and modifications could be made to circuit 400 to produce an equivalent circuit. By way of example, logic signals could be reversed and the inputs to the AND gates and NOR gates could be switched. In addition, the D flip-flops 410, 460 could be replaced with another type of flip-flop. Further, transistors 480, 482 may be conventional field effect transistors (FETs) but could be replaced with another type of switch. Any such modifications are considered within the scope of the present invention.

In addition, one of skill in the art will recognize that if the connection with the second circuit is a high-impedance connection, then an external pull-up or pull-down resistor may be needed. In an exemplary embodiment, a pull-up resistor may be provided between the reset and the power supply to pull the output up, and a pull-down resistor may be provided between the reset and GND to pull the output down.

The circuits described herein may find application in any circumstance in which an electrical circuit requires a reset signal of a specific polarity. By way of example, and not by limitation, applications include memory circuits, computer processor circuits, display circuits, data transmission circuits, smartcard circuits, and modem circuits.

Although particular embodiments been described and illustrated in detail, it is understood that the present disclosure has been made only by way of example, and that numerous changes in the combination and arrangement of parts can be resorted to by those skilled in the art without departing from the spirit and scope of the invention, as hereinafter claimed.

The words "comprise," "comprising," "include," "including," and "includes" when used in this specification and in the following claims are intended to specify the presence of stated features, integers, components, or steps, but they do not preclude the presence or addition of one or more other features, integers, components, steps, or groups.

What is claimed is:

1. A reset driver circuit for generating an input reset signal for the second circuit, comprising:

means for generating a first signal indicative of a required characteristic of an input reset signal for the second circuit;

means for comparing the first signal and a second signal indicative of a characteristic of a first input reset signal; and means for generating a second input reset signal that includes the required characteristic of an input reset signal for the second circuit.

2. The circuit of claim 1, wherein the means for generating a first signal indicative of a required characteristic of an input reset signal for the second circuit comprises a flip-flop that receives an input from the second circuit.

3. The circuit of claim 1, wherein the means for comparing the first signal and a second signal indicative of a characteristic of a first input reset signal comprises an AND gate.

4. The circuit of claim 1, wherein the means for generating a second reset signal that includes the required characteristic of an input reset signal for the second circuit comprises a switch connected to a voltage source.

5. The circuit of claim 4, wherein the switch comprises a transistor.

6. The circuit of claim 1, wherein the means for generating a second input reset signal that includes the required characteristic of an input reset signal for the second circuit comprises a switch connected to ground.

7. The circuit of claim 6, wherein the switch comprises a transistor.

8. The circuit of claim 1, wherein the means for generating further generates a third signal indicative of an another required characteristic of an input reset signal for the second circuit.

9. The circuit of claim 8, wherein the means for comparing further compares the third signal and the second signal indicative of a characteristic of the first input reset signal.

10. The circuit of claim 1, wherein the required characteristic is the polarity of the input reset signal.

11. The circuit of claim 1, wherein the means for generating a first signal indicative of a required characteristic of an input reset signal for the second circuit comprises means for sampling the voltage at an input of the second circuit.

12. A method of generating an input reset signal, comprising:
    generating a first signal indicative of a required characteristic of an input reset signal for the second circuit;
    comparing the first signal and a signal indicative of a characteristic of a first reset signal; and
    generating a second reset signal that includes the required characteristic of an input reset signal for the second circuit.

13. The method of claim 12, wherein generating a first signal indicative of a required characteristic of an input reset signal for the second circuit comprises receiving an input from the second circuit.

14. The method of claim 13, wherein comparing the first signal and a signal indicative of a characteristic of a first reset signal comprises executing a binary AND operation.

15. The method of claim 13, wherein generating a second reset signal that includes the required characteristic of an input reset signal for the second circuit comprises connecting the input reset signal to a voltage source.

16. The method of claim 13, wherein generating a second reset signal that includes the required characteristic of an input reset signal for the second circuit comprises connected a node connected to the input reset signal to ground.

17. The method of claim 13, further comprising generating a second signal indicative of an another required characteristic of the input reset signal for the second circuit.

18. The method of claim 17, further comprising comparing the second signal and a characteristic of the first reset signal.

19. The method of claim 13, wherein the required characteristic is the polarity of the input reset signal.

20. The method of claim 13, wherein generating a first signal indicative of a required characteristic of an input reset signal for the second circuit comprises sampling the voltage at an input of the second circuit.

21. A reset driver circuit for generating an input reset signal for the second circuit, comprising:
    a flip-flop having an input connected to the reset input of the second circuit;
    a first comparator including a first input connected to a first output of the flip-flop and a second input that receives an external reset signal;
    a second comparator including a first input connected to a second output of the flip-flop and a second input that receives the external reset signal;
    a first switch connected to the output of the first comparator for selectively connecting the reset input of the second circuit to a first voltage; and
    a second switch connected to the output of the second comparator for selectively connecting the reset input of the second circuit to a second voltage.

22. The circuit of claim 21, wherein the first comparator comprises an AND gate having a first input connected to the first output of the flip-flop and a second input connected to the external reset signal.

23. The circuit of claim 22, wherein the first switch comprises a transistor connected to the output of the AND gate for selectively connecting the reset input of the second circuit to the first voltage.

24. The circuit of claim 21, wherein the second comparator comprises an AND gate having a first input connected to the second output of the flip-flop and a second input connected to the external reset signal.

25. The circuit of claim 22, wherein the first switch comprises a transistor connected to the output of the AND gate for selectively connecting the reset input of the second circuit to the second voltage.

26. A reset driver circuit for generating an input reset signal for the second circuit, comprising:
    a first flip-flop having a first input for receiving a reset input signal, and generating a first signal indicative of a characteristic of the reset input signal;
    the second flip-flop having an input connected to a reset input pin of a second circuit and generating second and third outputs indicative of a characteristic of the reset input pin;
    a digital logic circuit for comparing the first signal with at least one of the second output and the third output;
    a first switch connected to the output of the digital logic circuit for selectively connecting the reset input of the second circuit to a first voltage; and
    a second switch connected to the output of the digital logic circuit for selectively connecting the reset input of the second circuit to a second voltage.

27. The reset driver circuit of claim 26, wherein the digital logic circuit comprises a first AND gate for comparing a characteristic of the reset input signal and the first signal and the second output.

28. The reset driver circuit of claim 26, wherein the digital logic circuit comprises a second AND gate for comparing a characteristic of the reset input signal and the first signal and the third output.

29. The reset driver circuit of claim 26, wherein the digital logic circuit comprises a first NOR gate for comparing a characteristic of the reset input signal and the first signal and the second output.

30. The reset driver circuit of claim 26, wherein the digital logic circuit comprises a second NOR gate for comparing a characteristic of the reset input signal and the first signal and the third output.

* * * * *